United States Patent [19]

Kinoshita et al.

[11] Patent Number: 5,078,809
[45] Date of Patent: Jan. 7, 1992

[54] METHOD FOR PRODUCING COLD-ROLLED STEEL SHEET

[75] Inventors: Masayuki Kinoshita; Akihiko Nishimoto; Toshiaki Urabe; Akira Sakamoto, all of Tokyo, Japan

[73] Assignee: Nippon Kokan Kabushiki Kaisha, Tokyo, Japan

[21] Appl. No.: 258,481

[22] Filed: Oct. 17, 1988

Related U.S. Application Data

[62] Division of Ser. No. 100,522, Sep. 24, 1987, abandoned.

[30] Foreign Application Priority Data

Sep. 27, 1986 [JP] Japan .................. 61-229106

[51] Int. Cl.$^5$ .................................... C21D 9/48
[52] U.S. Cl. ....................... 148/12 C; 148/12.3; 148/12 F
[58] Field of Search .............. 148/12 R, 12 C, 12.3, 148/12 F

[56] References Cited

U.S. PATENT DOCUMENTS

| | | | |
|---|---|---|---|
| 3,826,692 | 7/1974 | Kinoshita | 148/12 C |
| 3,879,232 | 4/1975 | Gondo et al. | 148/12 C |
| 3,897,280 | 7/1975 | Gondo et al. | 148/12 C |
| 3,988,174 | 10/1976 | Kawano | 148/12 C |
| 4,001,052 | 1/1977 | Nakazato et al. | 148/12 C |
| 4,040,873 | 8/1977 | Nakaoka et al. | 148/12 C |
| 4,145,235 | 3/1979 | Gondo et al. | 148/12 C |
| 4,410,372 | 10/1983 | Takahashi et al. | 148/12.3 |
| 4,445,946 | 5/1984 | Takahashi et al. | 148/12 F |
| 4,496,400 | 1/1985 | Irie et al. | 148/12.3 |
| 4,576,656 | 3/1986 | Satoh et al. | 148/12 C |
| 4,576,657 | 3/1986 | Satoh et al. | 148/12 C |
| 4,676,844 | 6/1987 | Satoh et al. | 148/12 C |

FOREIGN PATENT DOCUMENTS 75292 3/1983 European Pat. Off. .
80726 5/1984 Japan .

Primary Examiner—Deborah Yee
Attorney, Agent, or Firm—Frishauf, Holtz, Goodman & Woodward

[57] ABSTRACT

A method for producing cold-rolled steel sheets which comprises the steps of: producing slabs containing 0.001–0.003 wt. % C, 0.004 wt. % or less N and 0.03–0.20 wt. % P, providing that P(wt. %)×N(wt. %)≦3×10$^{-4}$ wt. % is satisfied; hot-rolling the slabs into hot-rolled steel strips; cold-rolling the hot-rolled steel strips at 60–95% reduction ratio into cold-rolled steel strips; and annealing continuously the cold-rolled strips at temperature of recrystallization temperature to Ac$_3$ transformation point temperature. The slabs further include 0.0005–0.0030 wt. % B. The hot-rolling is performed at finishing temperature ranging Ar$_3$ transfromation point to Ar$_3$ transformation +100° C., at cooling temperature of 750° C. and less.

8 Claims, 8 Drawing Sheets

METHOD FOR PRODUCING COLD-ROLLED STEEL SHEET

This is a division of application Ser. No. 07/100,522 filed Sept. 24, 1987, now abandoned.

BACKGROUND OF THE INVENTION

1. Field of the Invention

The present invention relates to cold-rolled steel sheets and a method for producing the cold-rolled steel sheets, and more particularly to steel sheets having good bake-hardenability and press formability and a method for producing such steel sheets.

2. Description of the Prior Arts

In view of reducing vehicle weight, saving fuel consumption and increasing safety, more highly strengthened steel sheets for automobiles have been strongly demanded. Above all, high strength cold-rolled steel sheets for outer panels such as doors and hoods of automobiles, having tensile strength of 35 to 45 kg/mm² and being good not only in bake-hardenability which is obtained by coating and baking process following press forming process but also in press formability. Continuous annealing has an advantage in giving such bake-hardenability to steel sheets. This is because the continuous annealing is so speedy in annealing and cooling, in comparison with box annealing that it can retain much of solute carbon in cold-rolled steel sheets. The continuous annealing has such a speed in the annealing and cooling process that steel sheets produced by the continuous annealing process are inferior, in press forming and deep drawing properties, to those produced by the box annealing process. For this reason, various methods of producing steel sheets which are good in press forming property, especially in deep drawing property have been studied. For example, a method for producing cold-rolled sheets having good deep drawing property is disclosed in a Japanese Patent Application Laid Open (KOKAI) No. 80726/84 as follows:

(a) using slabs consisting of:
C : 0.010 wt. % and less; Si: 0.5 wt. % and less;
Mn : 0.5 wt. % and less; N: 0.005 wt. % and less;
Sol. Al: 0.05 to 0.20 wt. %; P: 0.03 to 0.15 wt. %; and the Rest : Fe and impurities inevitable;

(b) hot-rolling the slabs at finishing temperature of 650° to 850° C. and at coiling temperature of 560° C. and less to produce hot-rolled steel strips; and (c) cold-rolling the hot-rolled strips under the conventional terms to produce cold-rolled steel strips, followed by the process of continuous annealing the cold-rolled strips under the conventional terms.

This method, however, is disadvantageous in the following points:

(1) Since extra-low carbon steel is, in general, difficult in allowing over-aging treatment to effectively work, it is impossible to effectively control solute carbon in amount. Consequently, the steel sheets produced by this method have much of solute carbon and high bake-hardenability, while their antiaging property at room temperature is inferior to the anti-aging property of steel sheets heat-treated by box annealing process.

(2) Owing to addition of P in order to improve strength, abnormal coarse grains are easy to be formed in the continuous annealing process. Consequently, the steel sheets produced by this method have duplex structure, and are apt to cause drop of ductility and occurrence of a deficit of surface coarseness when they are press-formed.

(3) Owing to the low finishing temperature, growth of abnormal coarse grains is further encouraged.

SUMMARY OF THE INVENTION

It is an object of the present invention to stably and economically produce, by means of continuous annealing process, high tensile strength cold-rolled steel sheets for doors and hoods as outer panels of automobiles, which have good properties of bake-hardening, press forming and anti-aging with tensile strength of 35 to 45 kg/mm².

In accordance with the present invention, a method is provided for producing cold-rolled steel sheets which comprises the steps of:

| | |
|---|---|
| C | 0.001 to 0.003 wt. %; |
| N | 0.004 wt. % and less; |
| Si | 1.0 wt. % and less; |
| Mn | 0.05 to 0.70 wt. %; |
| S | 0.020 wt. % and less; and |
| P | 0.03 to 0.20 wt. %; |
| Sol. Al | 0.01 to 0.15 wt. %, and |

P(wt. %) ×N(wt. %) being $3 \times 10^{-4}$ wt. % and less hot-rolling the slabs into hot-rolled steel strips:

cold-rolling the hot-rolled steel strips at reduction ratio of 60 to 95%, into cold-rolled steel strips and annealing continuously the cold-rolled steel transformation temperature.

Furthermore cold-rolled steel sheets are provided, which comprises:

| | |
|---|---|
| C | 0.001 to 0.003 wt. %; |
| N | 0.004 wt. % and less; |
| Si | 1.0 wt. % and less; |
| Mn | 0.05 to 0.70 wt. %; |
| P | 0.03 to 0.20 wt. %; |
| S | 0.020 wt. % and less; and |
| Sol. Al | 0.01 to 0.15 wt. %, |

P(wt. %)×N(wt. %) being $3 \times 10^{-4}$ wt. % and less.

Other objects and advantages of the present invention will become apparent from the detailed description to follow taken in conjunction with the accompanying drawings.

DESCRIPTION OF THE PREFERRED EMBODIMENT

Preferred Embodiment 1

Firstly, in the present invention, the reasons for limiting chemical composition of steel will now be described in respect to each of elements.

(1) Carbon

Carbon has a work of increasing bake-hardenability. But, if C content is less than 0.001 wt. %, a desired effect of the work to the back-hardenability cannot be obtained and, in addition, content of other elements must be increased to raise strength. On the other hand, if C content is over 0.003 wt. %, anti-aging property at room temperature becomes inferior, and, moreover, owing to increase of solute carbon, ductility and deep drawability become inferior. Consequently, C content ranges preferably from 0.001 to 0.003 wt. %. 0.001 to 0.0025 wt. % is more preferable.

Figure 1:
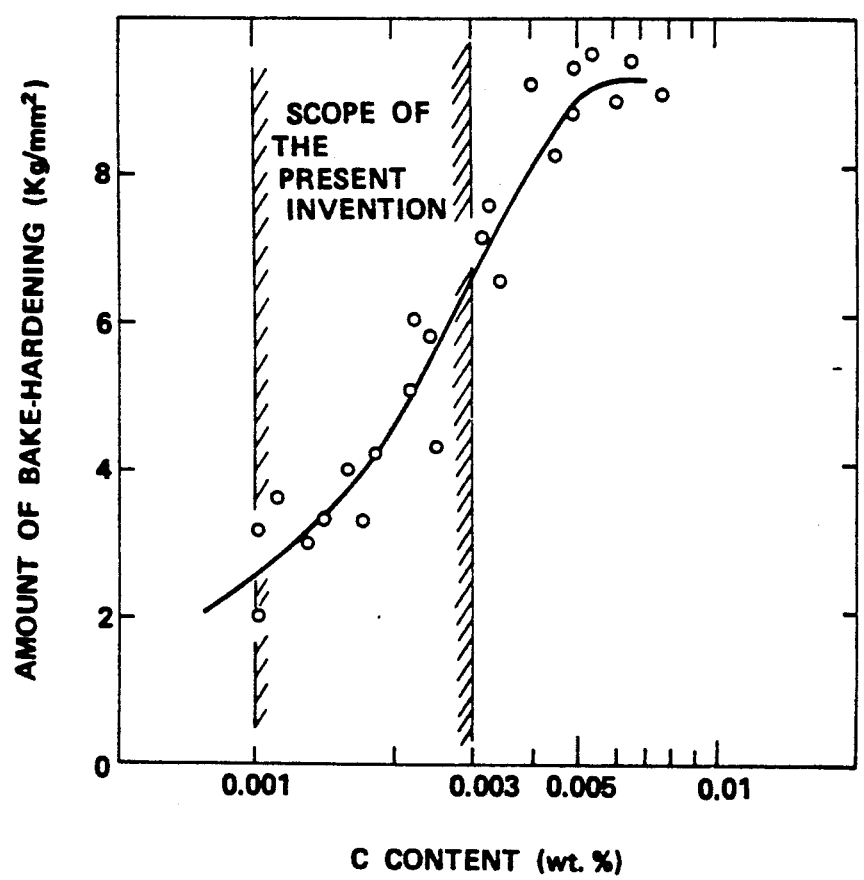
FIG. 1 is a graphic representation showing influence of carbon content on amount of bake-hardening according to the present invention.

FIG. 1 of the drawing graphically shows how carbon contained in an extra-low carbon cold-rolled steel sheets influences bake-hardenability. The bake-hardenability is represented by a balance between a stress value and an yield stress value where the stress value is a value obtained when test pieces are given 2% tensile pre-strain and the yield stress value is a value obtained after the test pieces given the pre-strain are being heated at 170° C. for 20 minutes. As clearly recognized from FIG. 1, in the case of C content being less than 0.001 wt. %, amount of bake-hardening becomes less than 2 kg/mm$^2$ and a desired bake-hardenability cannot be procured. Consequently, in the present invention, C content is allowed to be 0.001 wt. % and more.

Figure 2:
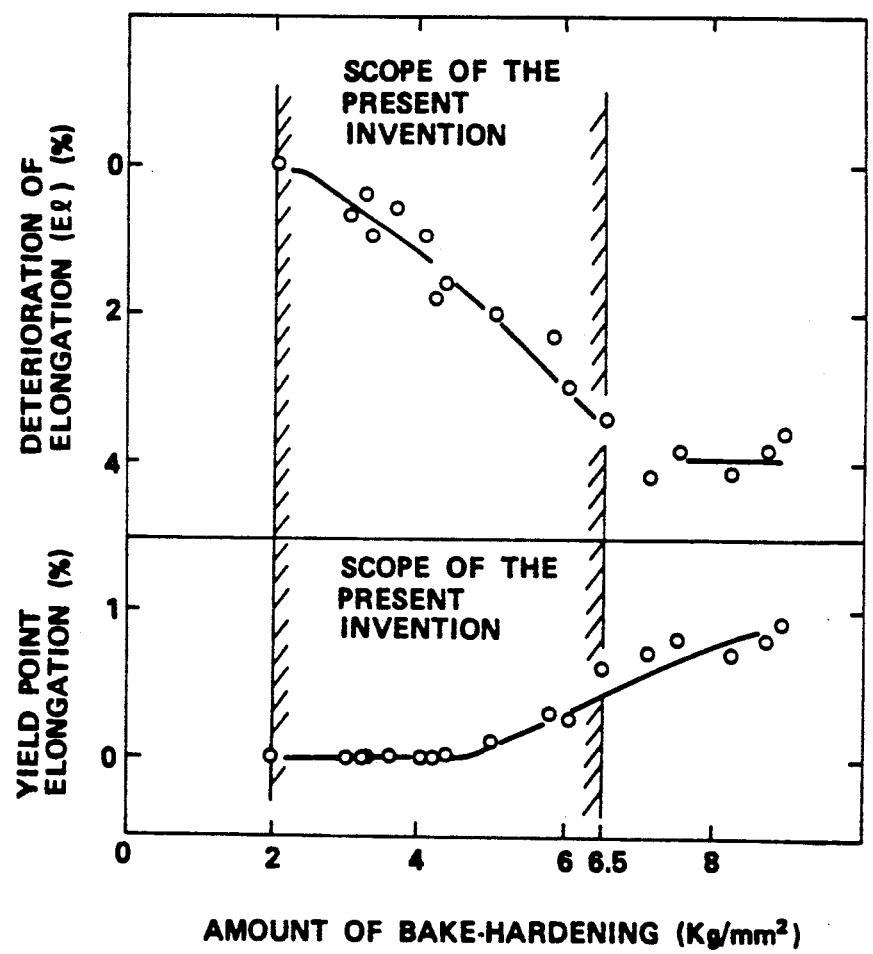
FIG. 2 is a graphic representation showing influence of amount of bake-hardening on anti-aging property according to the present invention.

FIG. 2 graphically shows influence of amount of bake-hardening on anti-aging property. The anti-aging property is represented by an yield point elongation and deterioration of the yield point elongation of test pieces to which aging treatment has been applied at 38° C. for 30 days. The deterioration of the elongation is indicated by a balance between the elongation values before and after the aging treatment. As apparently understood from FIG. 2, if amount of bake-hardening is over 6.5 kg/mm$^2$, the yield point elongation is over 0.5%, and the deterioration of the elongation is over 3.5%. Thus, the anti-aging property becomes inferior. Consequently, in the present invention, C content is allowed to be 0.003 wt. % and less, based on the relationship given in FIG. 1, so that amount of bake-hardening may not be over 6.5 kg/mm$^2$. If C content is 0.025 wt. % and less, amount of bake-hardening becomes 5.0 kg/mm$^2$, and yield point elongation is further encouraged. Consequently, 0.001 to 0.003 wt. % of C content is preferable, and 0.001 to 0.0025 wt. % is more preferable.

(2) Nitrogen

Nitrogen also plays a role of increasing bake-hardenability as solute N, since the bake-hardenability is of aging-hardening caused by C and N, which are both interstitial solute elements. However, if solute N is used for the bake-hardening, a drawback occurs that anti-aging property at room temperature becomes inferior. Consequently, in the present invention, N is allowed to completely be precipitated and fixed in the form of AlN, and, thus, appropriate amount of solute C is allowed to be left, whereby the bake-hardenability is increased by means of this solute C.

If N content is over 0.004 wt. %, owing to precipitation of minute nitrides being increased, the ductility is unfavorably affected. In addition, by those precipitated minute nitrides, growth of crystallization of grains in the continuous annealing process is impaired and deep drawability becomes inferior.

Figure 3:
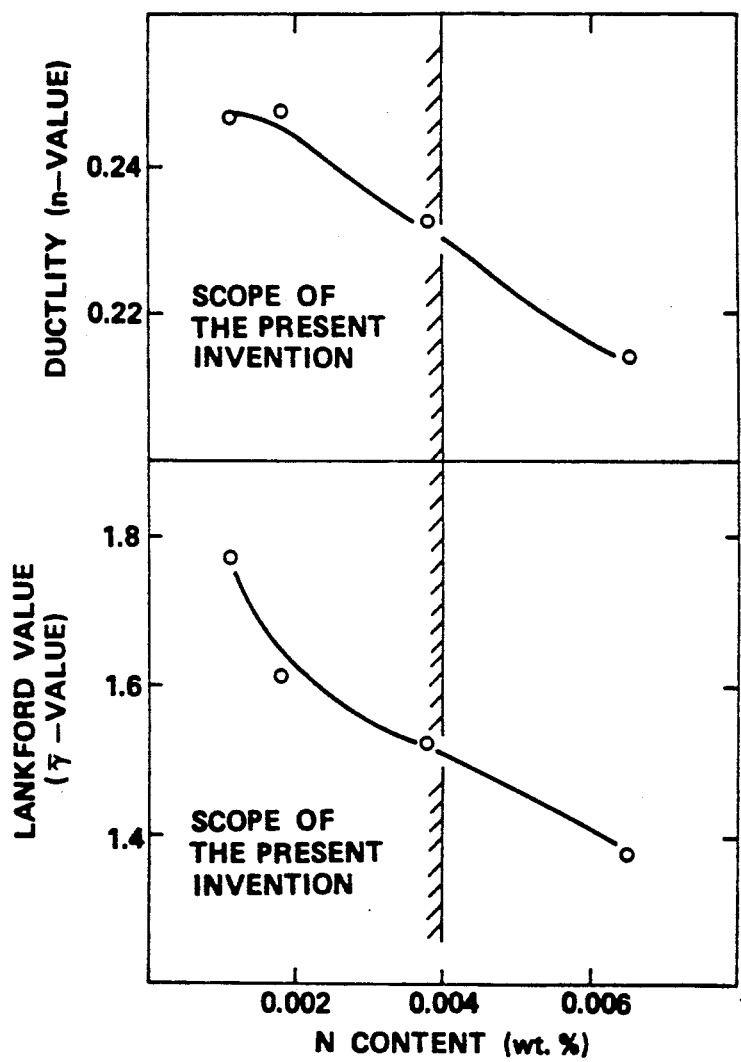
FIG. 3 is a graphic representation showing influence of nitrogen content on Lankford value and ductility according to the present invention.

FIG. 3 graphically shows influence of N content on Lankford value and ductility according to the present invention. Test pieces have been prepared on the following conditions: Slab Compositions: 4 kinds of N%

N wt. % : 0.0011, 0.0018, 0.0038 and 0.0065;
C wt. % : 0.0028; and
P wt. % : 0.08

Hot-rolling : finishing at 910° C. and coiling at 560° C.
Cold-rolling: reduction at 80% Continuous annealing : at 800° C.

Apparently recognized from FIG. 3, if N content is over 0.004 wt. %, Lankford value and ductility is lowered. In the case of N content being 0.0025 wt. % and less, in particular, Lankford value and ductility are excellent. Moreover, even if coiling is carried out at the vicinity of 560° C., there is an advantage that fairly good deep drawability can be obtained.

In general, if coiling temperature of hot-rolled steel strips is low, AlN is not fully precipitated in the hot-rolled steel strips. For this reason, as the result that solute N exists in the hot-rolled steel strips, growth of texture desirable for deep drawability is impaired. However, if N content is exceedingly low i.e. 0.0025 wt. % and less, owing to decrease of solute N in amount, deep drawability is improved.

Figure 4:
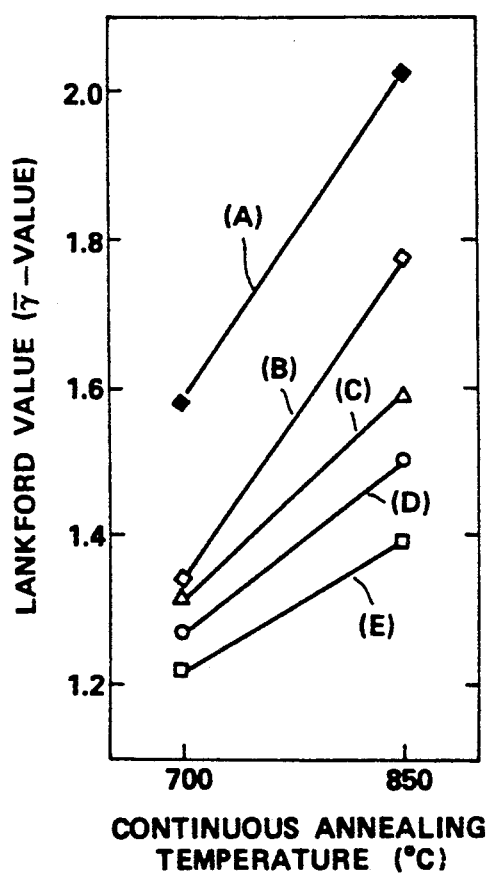
FIG. 4 is a graphic representation showing influence of nitrogen content and annealing temperature on Lankford value according to the present invention.

FIG. 4 graphically shows influence of N content and annealing temperature on Lankford value according to the present invention. In FIG. 4, (A),(B),(C),(D) and (E), each, show N contents and cold reduction ratios listed in Table 1 below. Note that the terms of hot-rolling and continuous annealing are same as mentioned in respect to FIG. 3.

TABLE 1

| | N content (wt. %) | Cold Reduction Ratio (%) |
|---|---|---|
| (A) | 0.0011 | 85 |
| (B) | 0.0011 | 70 |
| (C) | 0.0018 | 70 |
| (D) | 0.0038 | 70 |
| (E) | 0.0065 | 70 |

As clearly understood from FIG. 4, the lower N content is, the more remarkably Lankford value, due to high temperature annealing, is improved. Particularly in case (B) that N content is 0.0011 wt. % and cold reduction ratio is 85%, super-drawing quality cold-rolled steel sheets with Lankford value of 2.0 and more are produced. Consequently, it is preferable that N content is 0.004 wt. % and less. Note that owing to N's feature of restraining growth of abnormal coarse grains, it is more preferable that N content satisfies the terms mentioned hereinafter in relation to P content, in order to produce cold-rolled steel sheets having good ductility, and anti-coarsing in their surface.

(3) Phosphorus

Phosphorus has a role of increasing strength and improving plane anisotropy of steel. Namely, ferrite grains contained in hot-rolled extra-low carbon steel strips has become coarsened, and, resultantly, if those hot-rolled extra-low carbon steel strips are cold-rolled, and, subsequently, annealed continuously, there is a disadvantage in that the plane anisotropy may be increased. However, if an appropriate amount of phosphorus is added, the ferrite grains become small, considering extra-low carbon steel. Thus, the addition of P improves the plane anisotrophy.

However, if P content is less than 0.03 wt. %, the above mentioned effect cannot be attained. On the contrary, if it is over 0.20 wt. %, ductility, deep drawability and brittleness in forming process to follow, become inferior. Consequently, the range of 0.03 to 0.20 wt. % of P content is preferable.

(4) P(wt. %) x N(wt. %)

P is a very effective element, since it increases strength of steel property and still hardly impairs press formability of the steel property, and, besides, is inexpensive. But, if P is included in extra-low carbon steel sheets, abnormal coarse grains are apt to grow during the continuous annealing process. For example, coarse grains grew up in an operation on the following conditions:

| Slab Composition | extra-low carbon steel containing 0.0025 wt. % C, 0.15 wt. % P and 0.0042 wt. % N |
| --- | --- |
| Hot-rolling | finishing at 910° C. and coiling at 560° C. |
| Cold rolling | reduction at 75% |
| Continuous annealing | at 850° C. |

Figure 5:
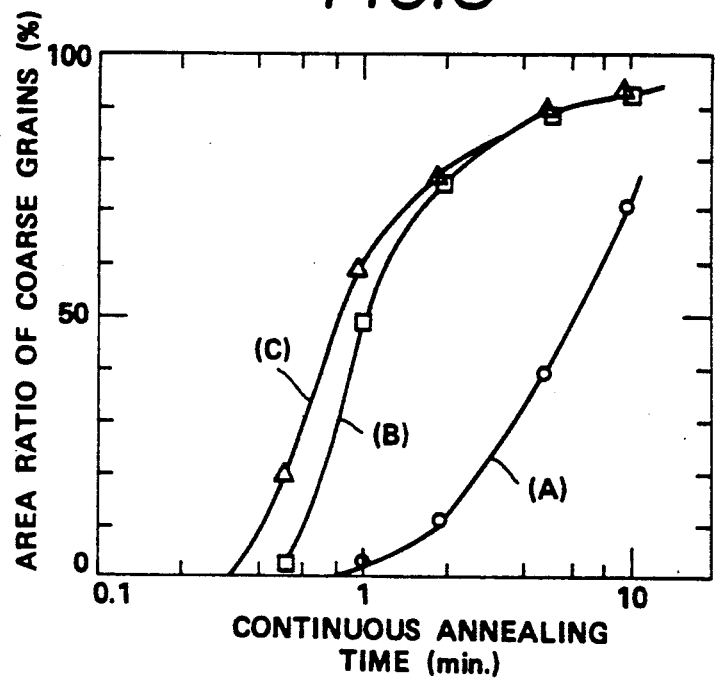
FIG. 5 is a graphic representation showing influence of phosphorus content on area ratio of coarse grain according to the present invention.

FIG. 5 graphically shows influence of phosphorus content on area ratio of coarse grains according to the present invention. In FIG. 5, (A) contains 0.01 wt. % P, (B) 0.08 wt. % P, and (C) 0.15% P, each, in test pieces of cold-rolled steel products, graphically showing changes of their area ratios of coarse grains in compliance with lapse of continuous annealing time. The production was carried out on the following conditions:

| Slab Composition | extra-low carbon steel containing 0.0025 wt. % C and 0.002 wt. % N |
| --- | --- |
| Hot-rolling | finishing at 910° C. and coiling at 560° C. |
| Cold-rolling | reduction at 75% |
| Continuous annealing | at 900° C. |

As apparently shown in FIG. 5, an area ratio of coarse grains of test piece (C) containing 0.15 wt% P was approximately 60% in one minute continuous annealing. On the other hand, an area ratio of coarse grains of test piece (A) containing 0.01 wt. % P was almost 0% in one minute continuous annealing process.

In this manner, abnormal coarse grains are apt to grow particularly in the case of ultra-low carbon steel having C content of 0.003 wt. % and less, and having good anti-aging property, because of having much of P necessarily contained in order to procure strength of products. In addition, abnormal coarse grains are also apt to grow in the case of N content being high.

Figure 6:
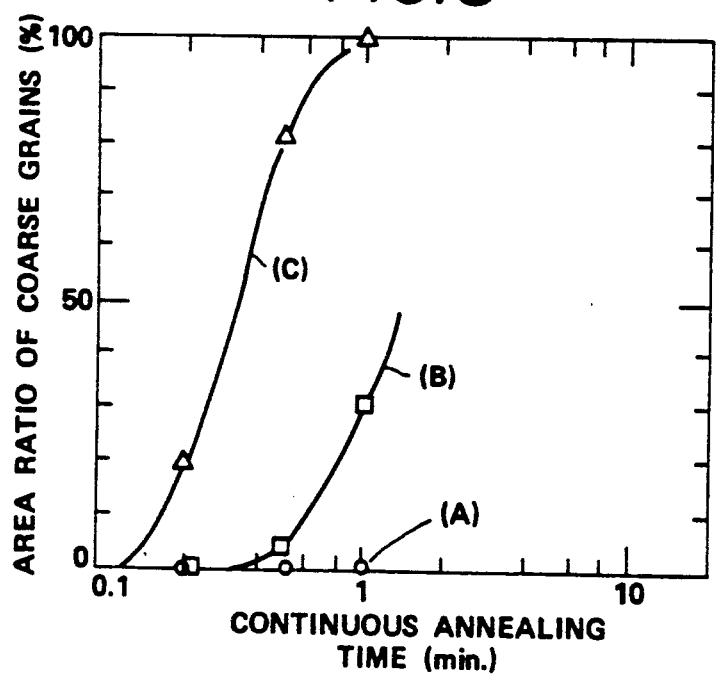
FIG. 6 is a graphic representation showing influence of nitrogen content on area ratio of coarse grains according to the present invention.

FIG. 6 graphically shows influence of nitrogen content on area ratio of coarse grain according to the present invention. In FIG. 6, (A) contains 0.0011 wt. % N, (B) 0.0028 wt. % N and (C) 0.0042 wt. % N, each, in test pieces of cold-rolled steel products. The production was carried out on the following conditions:

| Slab composition | extra-low carbon steel containing 0.0025 wt. % C and 0.15 wt. % P |
| --- | --- |
| Hot-rolling | finishing at 910° C. and coiling at 560° C. |
| Cold-rolling | reduction at 75% |
| Continuous annealing | at 800° C. |

As apparently recognized from FIG. 6, an area ratio of coarse grain of test piece (C) is 100% in one minute continuous annealing, while an area ratio of coarse grain of test piece (A) is 0% in one minute continuous annealing. Furthermore, since growth of abnormal coarse grains occurs owing to the second recrystallization reaction, the abnormal coarse grains are apt to grow, as continuous annealing temperature is becoming higher and continuous annealing time longer.

Figure 7:
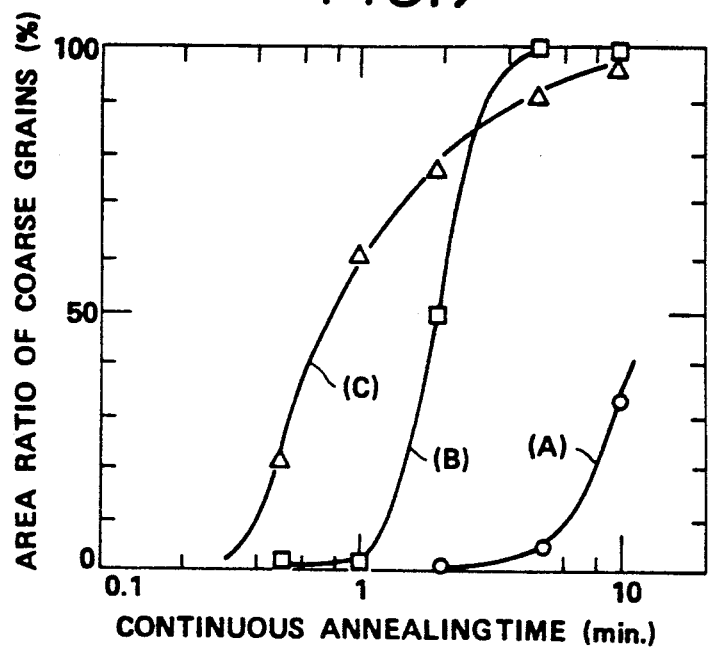
FIG. 7 is a graphic representation showing influence of temperature and time of continuous annealing on area ratio of coarse grains according to the present invention.

FIG. 7 graphically shows influence of continuous annealing temperature and time on coarse grain ratio according to the present invention. In FIG. 7 (A) is at 800° C., (B) 850° C. and (C) 900° C., each, in respect to continuous annealing temperatures the other conditions being as follows:

| Slab composition | extra-low carbon steel containing 0.0025 wt. % C, 0.147 wt. % P and 0.0028 wt. % N |
| --- | --- |
| Hot-rolling | finishing at 910° C. and coiling at 560° C. |
| Cold-rolling | reduction at 75% |

As apparently understood from FIG. 6, an area ratio of coarse grains of a test piece heat-treated at 900° C. is 60% in one minute continuous annealing, while another area ratio of coarse grain of a test piece heat-treated at 800° C. is 0%. In either of the cases, the longer the continuous annealing time becomes, the more the area ratio of coarse grains increases. It should be noted that abnormal coarse grains are apt to grow at coiling temperature of 660° C. and less, since the occurrence of the abnormal coarse grains is also related to the coiling temperature. From these points of view, it has been found that, in order to suppress the second recrystallization reaction during the continuous annealing process for the restraint of the abnormal coarse grain's growth, and to produce cold-rolled steel sheets having good ductility and anti-coarsing property on surface, controlling both of P and N in their mutual relationship is preferable.

Figure 8:
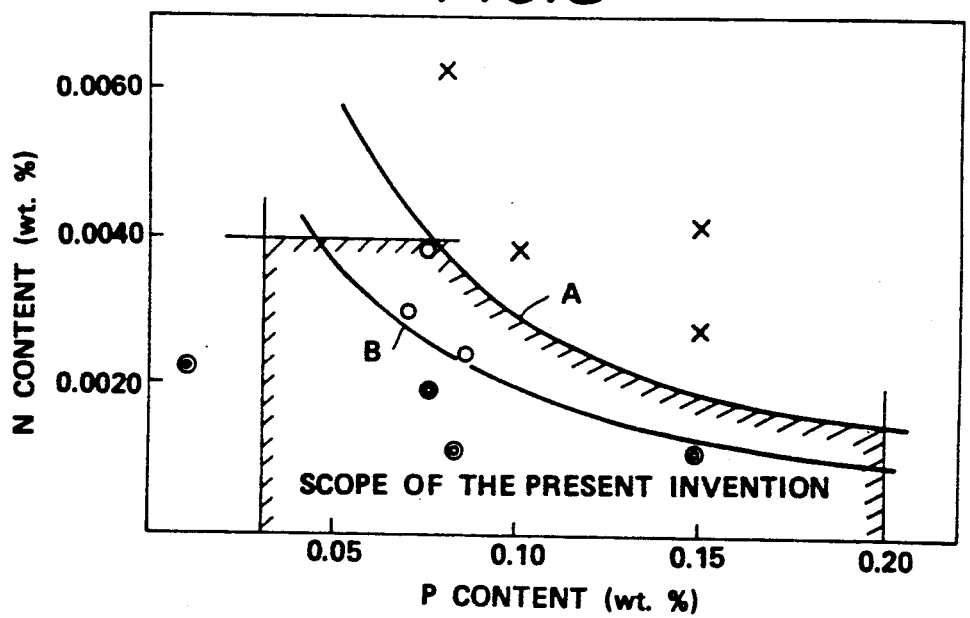
FIG. 8 is a graphic representation showing influence of phosphorus and nitrogen content on growth of abnormal coarse grains according to the present invention.

FIG. 8 graphically shows influence of P and N contents on growth of abnormal coarse grains according to the present invention. In FIG. 8, symbol marks x, and ⊙, each, show the following:

| | |
|---|---|
| X | abnormal coarse grains grew at 850° C. in one minute continuous annealing |
| ○ | abnormal coarse grains grew at 850° C. in two minute continuous annealing, although they did not at 850° C. in one minute continuous annealing |
| ⊙ | abnormal coarse grains did not grow even at 850° C. in two minute continuous annealing |

From FIG. 8, it has become clear that if P(wt. %) x N(wt. %) $\leq 3 \times 10^{-4}$ wt. % is satisfied, the growth of abnormal coarse grains due to the second recrystallization reaction does not occur during one minute annealing at 850° C., and, furthermore, that if P(wt. %)×N(wt. %)$\leq 2 \times 10^{-4}$ wt. % is satisfied, the growth of abnormal coarse grains due to the second recrystallization reaction does not occur even during two minute continuous annealing process at 850° C. Curve A shows P(wt. %)×N(wt. %)=$3 \times 10^{-4}$ wt. %, and Curve B P(wt. %) ×N(wt. %) =$2 \times 10^{-4}$ wt. %. Consequently, it is preferable that P and N contents satisfy the formula of P(wt. %)×N(wt. %) $\leq 3 \times 10^{-4}$ wt. %, and more preferable that P and N contents satisfy the formula of P(wt. %)×N(wt. %) $\leq 2 \times 10^{-4}$ wt. %. The cause that the growth of abnormal coarse grains occurs during the continuous annealing is presumed to be that recrystallization grains become minuter when P content is large, and that minute precipitates of AlN increase when N content is large, thereby to have the growth of ferrite grains weakened. Furthermore, due to P, increase of the minute AlN precipitates is encouraged. Consequently, the more P and N contents increase, the minuter the first recrystallization grains become and the worse growth of normal grains. As this result, the second recrystallization reaction is promoted when continuous annealing is performed at high temperature.

(5) Silicon

Silicon has a role of increasing strength of steel as Phosphorus does. But, since Si is an element being strongly oxidative, if more than 1.0 wt. % Si is contained, surface property of cold-rolled steel sheets becomes inferior. Accordingly, the range of 1.0 wt.% and less of Si content is preferable. Furthermore,:0.5. wt. % and less of Si content is preferable when good smoothness of the surface property, in particular, is demanded. In addition, when cold-rolled steel sheets are used for hot dip galvanizing, 0.1 wt. % and less of Si content is preferable to obtain good zinc adhesion property.

(6) Manganese

Manganese has an effect of fixing S, which is impurity, in the form of MnS to suppress hot-brittleness of steel property. However, if Mn content is less than 0.05 wt. %, the effect can not be obtained. On the contrary, when the MN content is over 0.70 wt. % deep drawability of cold-rolled steel sheets is lowered. Consequently, Mn content ranges preferably from 0.05 to 0.20 wt.,%.

(7) Sulfur

Sulfur impairs formability of steel sheets through formation of sulfides when sulfur content is over 0.020 wt. %. Therefore, 0.02 wt. % and less of S content is preferable.

(8) Sol. Al

Sol Al has an effect of deoxidation and fixation of N, which is harmful for anti-aging property of steel, by precipitating N in the form of AlN. But, if Sol. Al content is less than 0.1 wt. %, the effect cannot be attained. On the contrary, if Sol. Al content is over 0.15 wt., the production cost becomes expensive. Thus, the range of 0.01 to 0.15 wt. % is preferable. Furthermore, in order to ensure fixation of N contained in steel through precipitation of N even if hot coiling is carried out at a low temperature and continuous annealing is carried out in a short time, 0.03 to 0.15 wt. % of Sol. Al content is preferable.

(9) Boron

Boron has an effect of fixation of N in the form of BN through deposition, thereby to reduce precipitation amount of minute AlN. BN is a nitride having a considerably large grain size, and has no danger of worsening growth of normal size grains. Accordingly, in the present invention, B is allowed to be added supplementally and optionally as is required. However, if, regarding B content, B/N, an ratio represented by means of atomic weight, is over 1, solute B remains in steel, and resultantly worsens deep drawability of cold-rolled steel sheets. Consequently, it is preferable that B content satisfies the terms of B/N $\leq 1$. In this case, it is preferable that the above-mentioned formula of P(wt. %)×N(wt. %) is replaced by the formula of P(wt. %)×{N (wt. %)−(14/11)×B (wt. %)}, and the terms of P(wt. %)×{N (wt. %)−14/11)×B(wt. %)}$\leq 3 \times 10^{-4}$ wt. % is preferable. In addition, B has a further effect of increasing deep drawability and reducing plane anistorpy, by work of making a ferrite structure of hot-rolled steel sheets minute. Generally, Ar$_3$, transformation point temperature rises if C and N contents are small. Beside that, if P and Si, elements forming a ferrite structure are added, Ar$_3$ transformation point temperature further rises. Furthermore, in order to produce deep drawing quality cold-rolled steel sheets, it is necessary to have hot-coiling temperature increased upto Ar$_3$ transformation point temperature and higher. B has a further effect of suppressing ferrite transformation to decrease Ar$_3$ transformation point temperature, and is advantageous in that B allows easily hot-rolling to be stable in operation at high finishing temperature. For this effect, B content ranges preferably 0.0005 to 0.0030 wt. %. If B content is less than 0.0005 wt. %, the effect does not occur, while deep drawability is worsened, if over 0.0030 wt. %.

(10) Titanium

Titanium has an effect of fixing N in the form of TiN through precipitation to reduce amount of precipitation of minute AlN. TiN is a nitride having a considerably large grain size and has no danger of worsening growth of normal size grains. Accordingly, in the present invention, Ti is allowed to be added supplementally and optionally as is required. However, if, regarding Ti, Ti/N, a ratio represented by atomic weight is over 1, excessive amount of Ti fixes solute C in the form of TiC through precipitation and, therefore, bake-hardenability cannot be satisfactorily attained. Furthermore, temperature necessary for recrystallization is forced to rise, and, in addition, dispersion of minute TiC worsens growth of normal size grains. This results in allowing the second recrystallization to easily occur.

Consequently, it is recommendable that Ti content satisfies the terms of Ti/N $\leq 1$. In this case, the above-mentioned formula of P(wt. %)×N(wt. %) is replaced by the formula of P(wt. %)×N(wt. %)−(14/48)×Ti(wt. %)}, and the terms of P(wt. %)×N(wt. %)−(14/48)×Ti(wt. %) } $\leq 3 \times 10^{-4}$ wt. %. Furthermore, in the case that both of B and Ti are added, it is preferable that B/N+Ti $\leq 1$ is satisfied, and that P(wt. %)×N(wt. %)−(14/11)×B(wt. %)−(14/48)·Ti{$3 \times 10^{-4}$ wt. %.

Note that steel having chemical compositions described hereinbefore is made by a converter and vacuum degasing equipment in combination.

Secondly, operational terms of hot-rolling, cold rolling and continuous annealing of the present invention will now be described.

(1) Terms of Hot Rolling

Finishing temperature in hot-rolling slabs to produce hot-rolled steel strips ranges from $Ar_3$ transformation point temperature to $Ar_3$ transformation point temperature $+100°$ C. If the finishing temperature is less than the $AR_3$ transformation point, deep drawability is deteriorated and abnormal grains grow rapidly. If the finishing temperature is over $Ar_3$ transformation point temperature $+100°$ C., hot-rolled ferrite structure become coarsened and, deep drawability and plane anistrophy are lowered.

Coiling temperature ranges preferably 750° C. and less. When coiling is performed at 660° to 750° C. and solute N is fixed in the form of AlN through full precipitation, excellent deep drawability can be attained. If the coiling temperature is over 750° C., the effect in increasing deep drawability gets saturated, and this results in disadvantages in that hot-rolled ferrite structure is coasened, abnormal coarse grains grow up and efficiency in removing scale is lowered owing to much increase of the scale in quantity. Conventionally to produce deep drawing quality cold-rolled steel strips through continuous annealing, the coiling temperature has been customarily kept at 660° C. and more. According to the present invention, the coiling temperature is not necessarily kept 660° C. and more, i.e. even when hot-rolled steel strips are coiled at the vicinity of 300° C., steel sheets having good deep drawability and Lankford value of approximately 1.4 are finally produced. Since high temperature coiling has a drawback of reducing efficiency in removal of scale owing to much increase of the scale, low temperature coiling as mentioned above has great merits in operation.

The reason for the coiling temperature having been customarily maintained high is to allow carbides and nitrides to be precipitated and aggregated, thereby reducing, in amount, solute C and N which have appeared at recystallization annealing during continuous annealing process.

On the contrary, in the present invention, owing to remarkable reduction of C and N contents, amount of solute C and N appearing at recrystallization annealing is reduced, and this is considered to result in improving deep drawability. A reduction schedule of hot-rolling and a cooling pattern performed on a run out table can be based on ordinary conditions. Furthermore, the following performance is very effective in making minute ferrite structure formed by hot-rolling thereby to improve deep drawability and to reduce plane anisotropy:

(a) arranging more precisely finishing and coiling temperatures (b) raising up reduction ratio greatly at the last half stage in finish rolling (c) cooling rapidly hot-rolled strips as early as possible at the first half stage of cooling on a run out table.

Hot-rolling can be any of those rolling directly slabs as produced through continuous casting; rolling slabs heated at high temperature in a heating furnace after production thereof through continuous casting; and rolling slabs heated in a heating furnace, the slabs have been at room temperature.

(2) Terms of Cold Rolling

Figure 9:
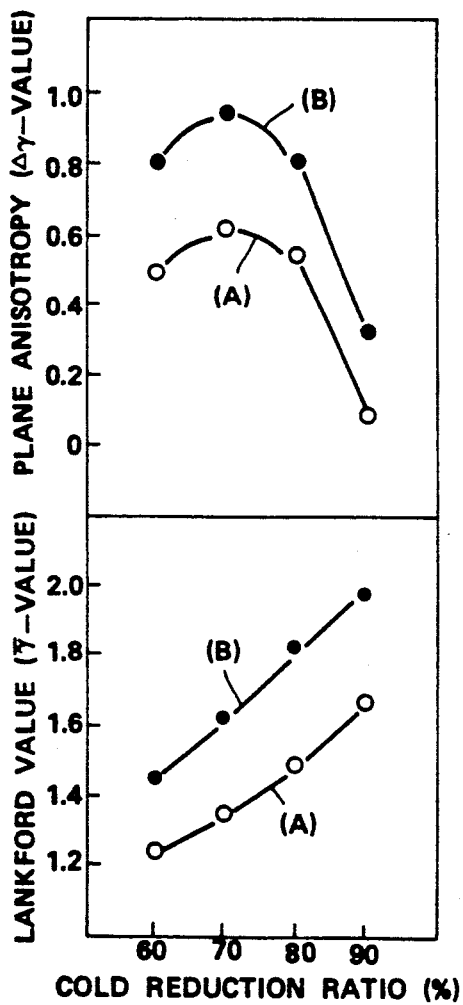
FIG. 9 is a graphic representation showing influence of cold reduction ratio on Lankford value and plane anisotropy according to the present invention.

Reduction ratio ranges preferably 60 to 95%. FIG. 9 graphically shows influence of cold reduction ratio on Lankford value and plane anisotropy. Test pieces taken from cold-rolled strips which have been produced on the following conditions.

| Slab composition | extra-low carbon steel containing 0.002 wt. % C, 0.25 wt. % Si and 0.04 wt. % P |
|---|---|
| Hot-rolling | finishing at 900° C., and coiling at 550° C. and 680° C. |
| Cold-rolling | reduction at 60 to 90% |
| Continuous annealing | at 800° C. |

From the test-pieces having tensile strength of 35 kg/mm² class, their Lankford value and plane anisotropy were studied. In FIG. 9, (A) is an influence in the case of the 550° C. coiling temperature, and (B) in the case of the 680° C. coiling temperature.

As clearly understood from FIG. 9, if the reduction ratio is less than 60%, deep drawability cannot be satisfactorily attained, while, if over 95%, rolling by means of an ordinary tandem mill is difficult. The plane anistorpy is the largest when the reduction rate is about 70%. Consequently, the reduction ratio is preferably set to 75% and more.

(3) Terms of Continuous Annealing

Figure 10:
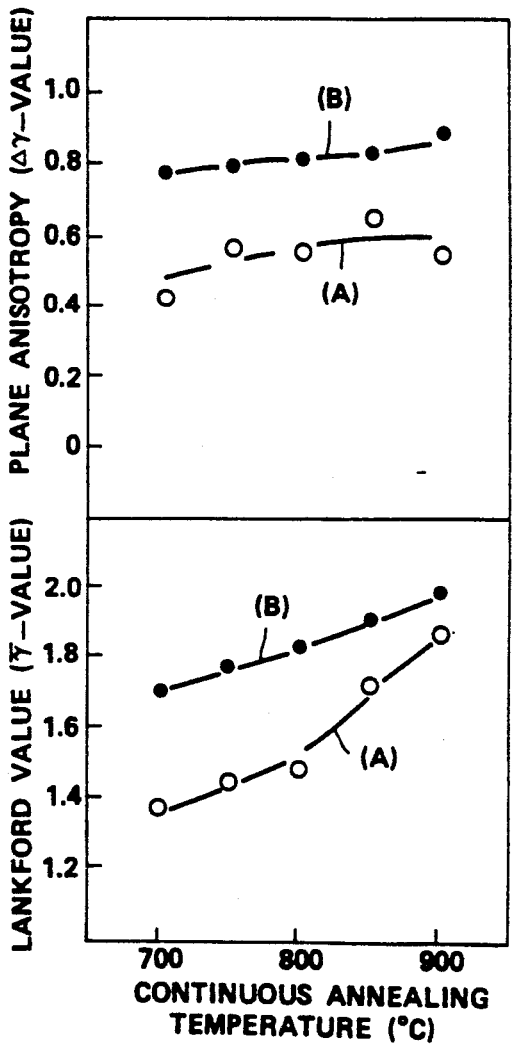
FIG. 10 is a graphic representation showing influence of continuous annealing temperature on Lankford value and plane anisotropy according to the present invention.

Continuous annealing temperature ranges from recrystallization temperature to Ac3 transformation point temperature. FIG. 10 graphically shows influence of the continuous annealing temperature on Lankford value and plane anisotropy. Test pieces taken from cold-rolled steel strips which have been produced on the following conditions:

| Slab Composition | extra-low carbon steel containing 0.002 wt. % C, 0.25 wt. % Si and 0.04 wt. % P |
|---|---|
| Hot-rolling | finishing temperature at 900° C., and coiling temperature at 550° C. and at 680° C. |
| Cold-rolling | reduction at 80% |
| Continuous Annealing | at 700° C. to 900° C. |

From the test pieces having tensile strength of 35 kg/mm² class, their Lankford value and plane anisotropy were studied. In FIG. 10, (A) is an influence in the case of the 550° C. coiling temperature, and (B) in the case of the 680° C. coiling temperature.

Hitherto, to produce deep drawing quality cold-rolled steel sheets, the continuous annealing temperature has been required to be 800° C. and more. According to the present invention, however, the high temperature of 800° C. and more is not necessary. Cold-rolled steel sheets having good deep drawability can be produced even at a continuous annealing temperature of the vicinity of 700° C. just above the recrystallization temperature, and cold-rolled steel sheets having a Lankford value of 1.4 can be produced even at a coiling temperature of 550° C.

If the continuous annealing temperature is lower than the recrystallization temperature, deep drawability cannot be satisfactorily attained. On the contrary, if it becomes Ac3 transformation point temperature and more, the structures become randomized, and, resultantly, the deep drawability becomes the worse.

The reason why deep drawing quality cold-rolled steel sheets can be produced as described in the foregoing is that minute carbides and nitrides rarely are precipitated because of having used high purity steel which has no elements forming carbides and nitrides, and has least C and N contents. Enabling, thus, to producing, at the low continuous annealing temperature, cold-rolled steel sheets having good deep drawability is one of the most remarkable characteristics of the present invention, and this low temperature can attain reduction of production cost.

Preferred Embodiment 2

In the case of producing high purity steel, ferrite structure, of steel formed by hot-rolling become coarsened, depending of the terms of hot-rolling. When the ferrite structure is coarsened, in the case of low continuous annealing temperature, recrystallization becomes slow and incomplete.

Figure 11:
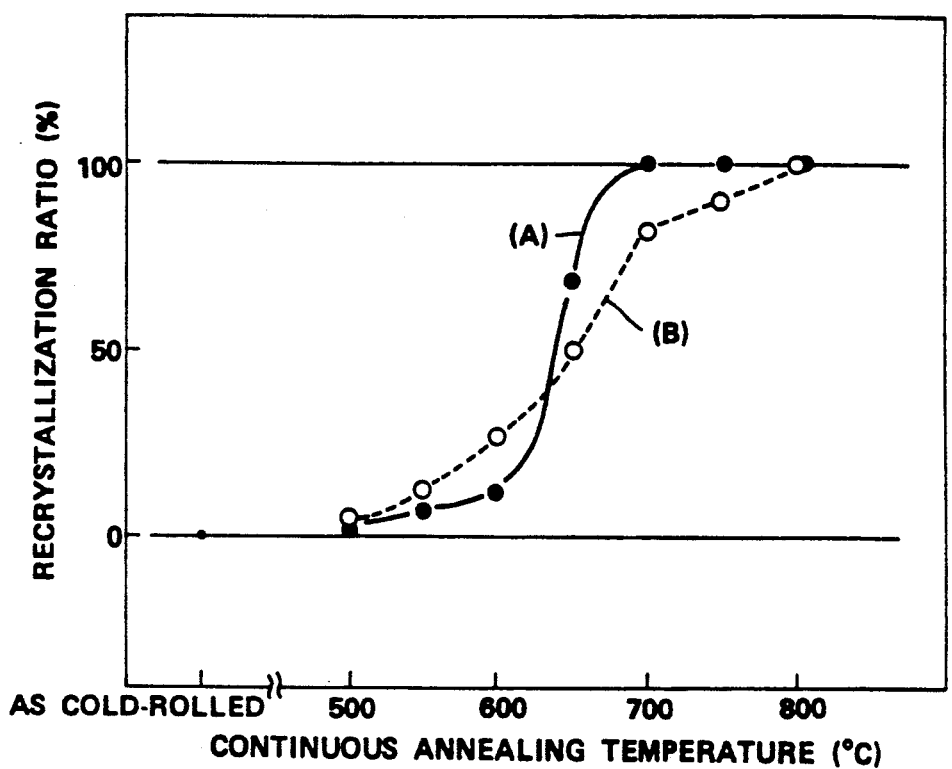
FIG. 11 is a graphic representation showing influence of continuous annealing temperature on recrystallization ratio according to the present invention.

FIG. 11 graphically shows influence of annealing temperature on recrystallization ratio according to the present invention, (A) shows an influence in the case of ferrite grain size No., formed by hot-rolling, being 7.8, and (B) in the case of ferrite grain size No., formed by hot-rolling, being 6.6. The operation conditions are as follows:

| Operation (A) | |
|---|---|
| Slab composition | extra-low carbon steel containing 0.002 wt. % C, 0.25 wt. % Si, 0.04 wt. % P and 0.002 wt. % N |
| Hot-rolling | finishing at 900° C. and coiling at 680° C. |
| Cold-rolling | reduction at 80% |
| Continuous annealing | at 500 to 800° C. for 30 secs. |
| Operation (B) | |
| Slab Composition | extra-low carbon steel containing 0.002 wt. % C, 0.25 wt. % Si, 0.04 wt. % P and 0.002 wt. % N |
| Hot-rolling | finishing at 960° C. and coiling at 710° C. |
| Cold-rolling | reduction at 80% |
| Continuous Annealing | at 500 to 800° C. for 30 secs. |

As apparently recognized from FIG. 11, in the case of ferrite grain size of No. 7.8, recrystallization ratio of ferrite is 100%. However, in the case of ferrite grain size of No. 6.6, to allow the ferrite to be 100%, the annealing temperature has to be raised upto 80° C.

Figure 12:
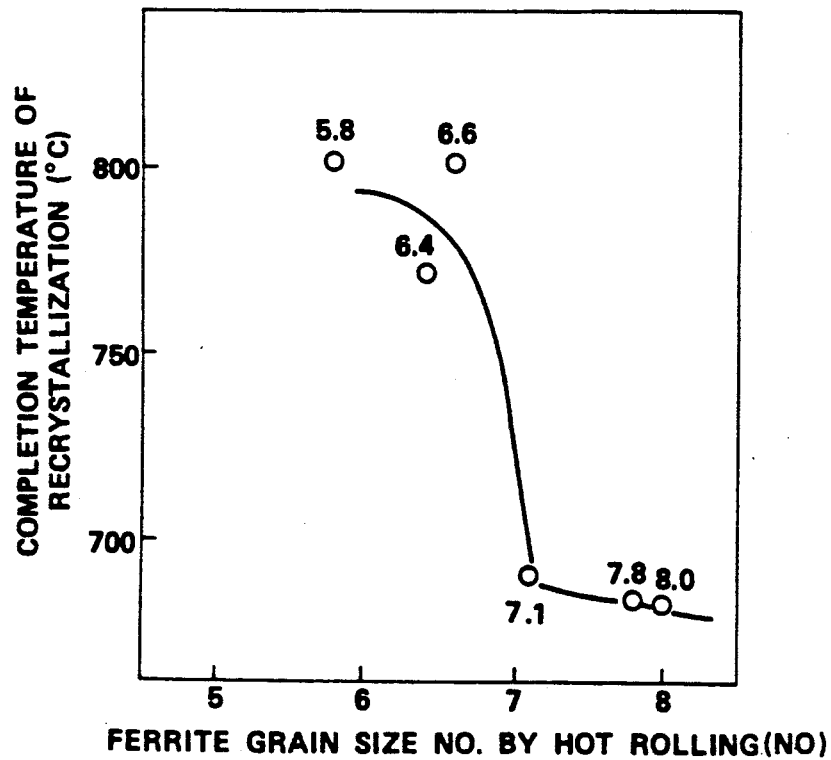
FIG. 12 is a graphic representation showing influence of ferrite grain size on temperature completing recrystallization according to the present invention.

FIG. 12 graphically shows influence of ferrite grain size by hot-rolling on completion temperature of recrystallization according to the present invention. This shows temperatures enabling ferrite grains formed by hot-rolling to complete 100% recrystallization when cold-rolled steel sheets are produced on the following conditions: (a) slabs of extra-low carbon steel containing 0.002 wt. % C, 0.025 wt. % Si, 0.04 wt. % P and 0.002 wt. % N are hot-rolled to produced hot-rolled steel strips providing that finishing and coiling temperature are varied; (b) the hot-rolled steel strips having various ferrite grain sizes are cold-rolled to produce cold-rolled steel strips at 80% reduction ratio; and (C) the cold-rolled steel strips are continuously annealed for 30 seconds. The hot-rolling and coiling temperatures varied are shown in Table 2 below.

TABLE 2

| | Finishing Temps. (°C.) | Coiling Temps. (°C.) |
|---|---|---|
| Ferrite | 5.8 | 860 | 500 |
| grain size | 6.4 | 960 | 680 |

TABLE 2-continued

| | Finishing Temps. (°C.) | Coiling Temps. (°C.) |
|---|---|---|
| Nos. by | 6.6 | 950 | 500 |
| Hot-rolling | 7.1 | 900 | 680 |
| | 7.8 | 910 | 680 |
| | 8.0 | 910 | 500 |

As apparently seen from FIGS. 11 and 12, it is recommendable that, to obtain 100% recrystallized ferrite grains formed by hot-rolling through continuous annealing at temperature less than 800° C., ferrite grain size of structure is a minute grain size of No. 7.0 and more. Furthermore, to allow the ferrite grain size to be No. 7 or more, it is receommendable that finishing temperature ranges from Ar$_3$ transformation point temperature to Ar$_3$ transformation point temperature +60° C., and that coiling temperature is 700° C. and less. In addition, the following is also effective in making minute the ferrite grain size of the structure:

(a) allowing steel to contain 0.03 to 0.2 wt. % P
(b) adding B so that B/N, a ratio of atomic weight, may be 1 or less
(c) applying strong reduction at the last half stage in finish rolling
(d) coiling rapidly at the first half stage of run-out spraying in cooling hot-rolled steel strips It should be noted that it is useful to ensure a desired finishing temperature of edge portions of steel strips being hot-rolled by using a heater, since most of portions of steel strips whose recrystallization becomes slow are the edge portions whose finishing temperature drops.

As above described, the present invention enables to complete 100% recrystallization of ferrite and to obtain a desired deep drawability, even if the annealing temperature is low temperature less than 800° C. Moreover, the present invention enables improving the deep drawability remarkably, if the annealing temperature is raised upto 800° C. and more, since this method of the present invention allows crystal grains to grow smoothly and desirably without danger of occurrence of abnormal coarse grains due to the second recrystallization. Particularly in the case of steel containing 0.001 wt. % N i.e. exceeding low content, by means of raising continuous annealing temperature upto 850° C., this method can increase Lankford value by approximately 0.4, in comparison with the case of the continuous annealing temperature being 700° C. Consequently, the present invention allows to produce, in considerable low cost, super deep drawing quality cold-rolled steel strips having 1.8 and more Lankford value, which have hitherto been limited only to extra-low carbon cold-rolled steel strip sheets to which elements forming strongly carbides and nitrides have been added.

The continuous annealing time is about 10 seconds enough to complete 100% recrystallization of ferrite grains. Provided, however, that when the coiling temperature is low, it is desirable for the continuous annealing time to be least 30 seconds at 750° annealing temperature, and, to be at least about 60 seconds at less than 750° C. annealing temperature, since it is recommendable to have solute N completely precipitated and fixed in the form of AlN during the continuous annealing.

There is no need for limiting specifically heating speed and cooling speed in the continuous annealing process. Over-aging treatment on the way of or after cooling process can be performed as is required.

Heating method during the continuous annealing process can be any one of those which are radiant tube heating, direct fire heating and induction heating. Cooling method during the continuous annealing process can be anyone selected from those which are water quenching, hot water quenching, gas-jet cooling water-cooled-roll cooling and water-and-gas mix cooling. Cold-rolled steel sheets according to the method of the present invention can also be used satisfactorily as base sheets for surface treated steel sheets.

EXAMPLE

Test pieces of No. 1 to No. 19 having chemical compositions as shown in Table 3 were taken from cold-rolled steel sheets which had been produced, based on the conditions of hot-rolling, cold-rolling and continuous annealing as shown in Table 3. the chemical compositions, each, fell in the scope of the present invention.

The cold-rolled steel sheets for the sample pieces were produced in a process, wherein steel ingots containing chemical compositions were prepared through a converter and vacuum degassing equipment in combination, and slabs, produced through slabbing the steel ingots, were through hot-rolling and cold-rolling followed by continuous annealing on the conditions as shown in Table 3.

The test pieces of Nos. 1 to 19 were checked with respect to yield strength (Y.P.) tensile strength (T.S.) elongation (E1), ductility (n-value), deep drawability (r), plane anisotropy ($\Delta r$), amount of bake-hardening (BH) and occurrence of growth of abnormal coarse grains. The results were shown in Table 5. any and all of the test pieces made good marks with respect to yield strength (Y.P.), tensile strength (T.S.) elongation (E1), ductility (n-value), deep drawability (r), plane anisotropy ($\Delta r$) and amount of bake-hardening (B.H.). No growth of abnormal coarse grains occurred therefrom. The test pieces showed good anti-aging property at room temperature, and, in the aging treatment at 38° C. for 30 days, the yield point elongation (YPE1) was 0.5% and less, and the drop of the elongation was 0.35% and less. In addition, from steel slabs, each, having the same chemical composition as same as pieces Nos. 6 and 7, or Nos. 10 through 14, cold-rolled steel strips having various steel properties could be produced by means of varying terms and conditions of hot-rolling, cold-rolling and continuous annealing.

TABLE 3

| | Hot-rolling | | Cold-rolling | Continuous annealing | |
|---|---|---|---|---|---|
| No. | Finishing Temp. (°C.) | Coiling Temp. (°C.) | Cold Reduction Ratio (%) | Annealing Temp. (°C.) | Annealing Time (min.) |
| 1 | 910 | 560 | 80 | 800 | 1 |
| 2 | 910 | 560 | 80 | 800 | 1 |
| 3 | 910 | 560 | 80 | 800 | 1 |
| 4 | 910 | 560 | 75 | 850 | 1 |
| 5 | 910 | 560 | 75 | 850 | 1 |
| 6 | 900 | 560 | 75 | 850 | 1 |
| 7 | 870 | 560 | 75 | 850 | 1 |
| 8 | 900 | 560 | 75 | 850 | 1 |
| 9 | 870 | 560 | 75 | 850 | 1 |
| 10 | 900 | 560 | 85 | 700 | 1 |
| 11 | 900 | 560 | 70 | 800 | 0.5 |
| 12 | 900 | 680 | 70 | 700 | 0.5 |
| 13 | 900 | 680 | 70 | 800 | 0.5 |
| 14 | 900 | 680 | 85 | 850 | 1 |
| 15 | 900 | 560 | 75 | 800 | 1 |
| 16 | 900 | 680 | 75 | 800 | 0.5 |
| 17 | 900 | 560 | 75 | 850 | 1 |
| 18 | 870 | 560 | 80 | 850 | 1 |
| 19 | 870 | 560 | 80 | 850 | 1 |

TABLE 4

| | Chemical Composition (wt %) | | | | | | | | | | |
|---|---|---|---|---|---|---|---|---|---|---|---|
| No. | C | Si | Mn | P | S | Sol. Al | N | B | Ti | P × N | |
| 1 | 0.0028 | 0.01 | 0.12 | 0.084 | 0.010 | 0.061 | 0.0011 | — | — | $0.9 \times 10^{-4}$ | |
| 2 | 0.0027 | 0.01 | 0.15 | 0.077 | 0.009 | 0.026 | 0.0018 | — | — | $1.4 \times 10^{-4}$ | |
| 3 | 0.0029 | 0.01 | 0.12 | 0.076 | 0.010 | 0.045 | 0.0038 | — | — | $2.9 \times 10^{-4}$ | |
| 4 | 0.0027 | 0.01 | 0.11 | 0.077 | 0.010 | 0.027 | 0.0024 | — | — | $1.8 \times 10^{-4}$ | |
| 5 | 0.0024 | 0.01 | 0.12 | 0.154 | 0.009 | 0.045 | 0.0011 | — | — | $1.7 \times 10^{-4}$ | |
| 6 | 0.0026 | 0.01 | 0.14 | 0.082 | 0.008 | 0.031 | 0.0028 | 0.0020 | — | $0.2 \times 10^{-4}$ | B/N < 1 |
| 7 | " | " | " | " | " | " | " | " | — | " | " |
| 8 | 0.0020 | 0.01 | 0.14 | 0.135 | 0.008 | 0.045 | 0.0034 | — | 0.007 | $1.9 \times 10^{-4}$ | Ti/N < 1 |
| 9 | 0.0018 | 0.01 | 0.14 | 0.146 | 0.008 | 0.050 | 0.0035 | 0.0013 | 0.005 | $0.6 \times 10^{-4}$ | B/N + TiN < 1 |
| 10 | 0.0016 | 0.24 | 0.16 | 0.038 | 0.005 | 0.045 | 0.0023 | — | — | $0.9 \times 10^{-4}$ | |
| 11 | " | " | " | " | " | " | " | — | — | " | |
| 12 | " | " | " | " | " | " | " | — | — | " | |
| 13 | " | " | " | " | " | " | " | — | — | " | |
| 14 | " | " | " | " | " | " | " | — | — | " | |
| 15 | 0.0022 | 0.22 | 0.14 | 0.102 | 0.004 | 0.040 | 0.0015 | — | — | $1.5 \times 10^{-4}$ | |
| 16 | 0.0020 | 0.30 | 0.14 | 0.124 | 0.005 | 0.036 | 0.0018 | — | — | $2.2 \times 10^{-4}$ | |
| 17 | 0.0018 | 0.48 | 0.15 | 0.156 | 0.003 | 0.043 | 0.0014 | — | — | $2.2 \times 10^{-4}$ | |
| 18 | 0.0024 | 0.24 | 0.14 | 0.042 | 0.004 | 0.038 | 0.0024 | 0.0015 | — | $0.2 \times 10^{-4}$ | B/N < 1 |
| 19 | 0.0018 | 0.33 | 0.13 | 0.122 | 0.003 | 0.044 | 0.0027 | 0.0013 | — | $1.2 \times 10^{-4}$ | B/N < 1 |

TABLE 5

| No. | YP (kg/mm$^2$) | TS (kg/mm$^2$) | El (%) | n-value | r̄ | Δr | BH (kg/mm$^2$) | Abnormal Coarse Grains |
|---|---|---|---|---|---|---|---|---|
| 1 | 21.4 | 35.6 | 47.0 | 0.246 | 1.77 | 0.38 | 5.4 | none |
| 2 | 21.7 | 35.4 | 46.3 | 0.247 | 1.61 | 0.34 | 5.0 | none |
| 3 | 22.0 | 36.1 | 43.5 | 0.232 | 1.52 | 0.36 | 5.7 | none |
| 4 | 22.3 | 36.4 | 44.2 | 0.240 | 1.64 | 0.60 | 4.8 | none |
| 5 | 27.3 | 41.3 | 40.6 | 0.237 | 1.59 | 0.56 | 4.7 | none |
| 6 | 21.6 | 35.8 | 46.8 | 0.245 | 1.72 | 0.50 | 5.5 | none |
| 7 | 22.3 | 36.2 | 47.1 | 0.248 | 1.80 | 0.44 | 5.8 | none |
| 8 | 27.6 | 40.4 | 40.1 | 0.236 | 1.65 | 0.52 | 4.0 | none |
| 9 | 27.8 | 41.4 | 40.6 | 0.238 | 1.77 | 0.42 | 4.2 | none |
| 10 | 23.8 | 37.3 | 45.0 | 0.233 | 1.50 | 0.33 | 4.1 | none |
| 11 | 22.4 | 36.4 | 44.6 | 0.236 | 1.53 | 0.60 | 4.0 | none |
| 12 | 22.2 | 36.2 | 44.8 | 0.237 | 1.64 | 0.74 | 4.6 | none |
| 13 | 21.7 | 35.8 | 45.2 | 0.238 | 1.72 | 0.68 | 4.3 | none |
| 14 | 20.4 | 35.0 | 46.7 | 0.237 | 2.08 | 0.47 | 3.9 | none |
| 15 | 25.6 | 38.3 | 43.6 | 0.239 | 1.58 | 0.55 | 4.1 | none |
| 16 | 28.4 | 41.1 | 39.7 | 0.233 | 1.50 | 0.61 | 4.0 | none |
| 17 | 32.9 | 46.7 | 36.6 | 0.221 | 1.47 | 0.30 | 3.8 | none |
| 18 | 27.7 | 40.8 | 40.1 | 0.233 | 1.63 | 0.31 | 4.5 | none |
| 19 | 33.2 | 46.2 | 37.4 | 0.222 | 1.52 | 0.27 | 4.1 | none |

Controller

For comparison, test pieces of Nos. 20 to 26 were taken from cold-rolled steel sheets which had been produced on the conditions of hot-rolling and cold-rolling, followed by continuous annealing as shown in Table 6. The cold-rolled steel sheets were produced in a process wherein steel ingots with chemical compositions as shown in Table 7 was prepared by means of both a converter and vacuum degassing equipment in combination, and slabs, made from the steel ingots, were rolled through hot-rolling and cold-rolling, followed by continuous annealing on the conditions as shown also in Table 6. The test results of the test pieces of Nos. 20 to 26 are given in Table 8.

Test piece No. 20 whose N content and formula of P(wt. %)×N(wt. %) were out of the scope of the present invention, marked poor not only in ductility (n-value) but also in deep drawability (r), and therefrom abnormal coarse grains grew up. Test piece No. 21 having P content which was out of the scope of the present invention showed low points both in yield strength (Y.P.) and tensile strength (T.S.). Test pieces Nos. 22 and 23 whose formula of P (wt. %)×N(wt %) failed to be within the scope of the present invention, allowed abnormal coarse grains to grow, and marked poor both in elongation (El) and ductility (n-value), and furthermore, their Lankford values (r-value) were low. Test piece No. 24 having B content higher than that of the present invention marked low Lankford value (r̄-value). Test piece No. 25 with higher Ti content showed low amount of bake-hardening (BH), and therefrom abnormal coarse grains grew up. Test piece No. 6 having C content out of the scope of the present invention had high amount of bake-hardening (BH), but marked low in Lankford value (r̄-value) as wheel as in ductility (n-value), and, in addition, its anti-aging property was poor.

TABLE 6

| | Hot-rolling | | Cold-rolling | Continuous annealing | |
|---|---|---|---|---|---|
| No. | Finishing Temp. (°C.) | Coiling Temp. (°C.) | Cold Reduction Ratio (%) | Annealing Temp. (°C.) | Annealing Time (min.) |
| 20 | 910 | 560 | 80 | 800 | 1 |
| 21 | 910 | 560 | 75 | 850 | 1 |
| 22 | 910 | 560 | 75 | 850 | 1 |
| 23 | 910 | 560 | 75 | 850 | 1 |
| 24 | 870 | 560 | 75 | 850 | 1 |
| 25 | 900 | 560 | 75 | 850 | 1 |
| 26 | 900 | 680 | 75 | 800 | 1 |

TABLE 7

| No. | Chemical Composition (wt %) | | | | | | | | | |
|---|---|---|---|---|---|---|---|---|---|---|
| | C | Si | Mn | P | S | Sol. Al | N | B | Ti | P × N |
| 20 | 0.0030 | 0.01 | 0.12 | 0.079 | 0.010 | 0.030 | 0.0065 | — | — | 5.1 × 10$^{-4}$ |
| 21 | 0.0022 | 0.01 | 0.11 | 0.014 | 0.010 | 0.029 | 0.0022 | — | — | 0.3 × 10$^{-4}$ |
| 22 | 0.0028 | 0.01 | 0.15 | 0.147 | 0.010 | 0.036 | 0.0028 | — | — | 4.1 × 10$^{-4}$ |
| 23 | 0.0025 | 0.01 | 0.12 | 0.150 | 0.010 | 0.060 | 0.0042 | — | — | 6.3 × 10$^{-4}$ |
| 24 | 0.0026 | 0.01 | 0.14 | 0.080 | 0.008 | 0.030 | 0.0026 | 0.0051 | — | B/N > 1 |
| 25 | 0.0029 | 0.01 | 0.15 | 0.138 | 0.009 | 0.039 | 0.0030 | — | 0.029 | Ti/N > 1 |
| 26 | 0.0045 | 0.26 | 0.13 | 0.043 | 0.003 | 0.035 | 0.0021 | — | — | 0.9 × 10$^{-4}$ " |

TABLE 8

| No. | YP (kg/mm$^2$) | TS (kg/mm$^2$) | El (%) | n-value | r̄ | Δr | BH (kg/mm$^2$) | Abnormal Coarse Grains |
|---|---|---|---|---|---|---|---|---|
| 20 | 22.6 | 36.7 | 40.7 | 0.214 | 1.27 | 0.29 | 5.5 | exist |
| 21 | 17.7 | 30.2 | 48.0 | 0.250 | 1.73 | 0.57 | 5.1 | none |

TABLE 8-continued

| No. | YP (kg/mm$^2$) | TS (kg/mm$^2$) | E1 (%) | n-value | $\bar{r}$ | $\Delta r$ | BH (kg/mm$^2$) | Abnormal Coarse Grains |
|---|---|---|---|---|---|---|---|---|
| 22 | 28.1 | 40.8 | 36.0 | 0.218 | 1.30 | 0.35 | 5.3 | exist |
| 23 | 28.5 | 41.7 | 34.7 | 0.213 | 1.22 | 0.28 | 5.6 | exist |
| 24 | 22.5 | 36.4 | 44.9 | 0.237 | 1.28 | 0.36 | 5.4 | none |
| 25 | 28.2 | 41.5 | 37.8 | 0.223 | 1.42 | 0.51 | 3.1 | exist |
| 26 | 25.5 | 36.3 | 42.4 | 0.214 | 1.29 | 0.34 | 7.6 | none |

What is claimed is:

1. A method for producing high strength steel sheets having good bake-hardenability which is a maximum of 6.5 kg/mm$^2$ and good press-formability comprising the steps of:

producing steel slabs comprising:
   0.001 to 0.003 wt. % C.;
   0.004 wt. % or less N;
   1.0 wt. % or less Si;
   0.05 to 0.70 wt. % Mn;
   0.03 to 0.20 wt. % P;
   0.020 wt. % or less S;
   0.01 to 0.15 wt. % Sol. Al:
   Ti having Ti/N ratio by atomic weight being 1 or less; and the balance being Fe and inevitable impurities, provided, however, that P (wt. %)×{N(wt. %)−(14/48)×Ti(wt. %)} ≦3×10$^{-4}$wt. %;
   hot-rolling the steel slabs at a finishing temperature of Ar$_3$ to AR$_3$ plus 100° C. and coiling at a temperature of 750° C. or less to prepare hot-rolled steel sheets;
   cold-rolling the hot-rolled sheets at a reduction ratio of 75 to 95% to prepare cold-rolled steel sheets; and
   annealing continuously the cold-rolled steel sheets at a temperature of a recrystallization temperature to Ac$_3$ transformation point temperature.

2. The method of claim 1, wherein said step of annealing continuously the cold-rolled steel sheets includes annealing continuously the cold-rolled sheets at a temperature of a recrystallization temperature to less than 800° C.

3. A method for producing high strength steel sheets having good bake-hardenability which is a maximum of 6.5 kg/mm$^2$ and good press-formability comprising the steps:

producing steel slabs comprising:
   0.001 to 0.003 wt. % C.;
   0.004 wt. % or less N;
   1.0 wt. % or less Si;
   0.05 to 0.70 wt. % Mn;
   0.03 to 0.20 wt. % P;
   0.020 wt. % or less S;
   0.01 to 0.15 wt. % Sol. Al;
   B having a B/N ratio by atomic weight being 1 or less;
   Ti having a i/N ratio by atomic weight being 1 or less; and
   the balance being Fe and inevitable impurities, provided, however, that P(wt. %) {N(wt. %)−(14/11)×B(wt. %)−(14/48)×Ti(wt. %) ≦3 ×10$^{-4}$wt. % and that B/N +Ti/N≦1;
   hot-rolling the steel slabs at a finishing temperature of AR$_3$ to AR$_3$ plus 100° C. and coiling at a temperature of 750° C. or less to prepare hot-rolled steel sheets;
   cold-rolling the hot-rolled sheets at a reduction ratio of 75 to 95% to prepare cold-rolled steel sheets; and
   annealing continuously the cold rolled steel sheets at a temperature of a recrystallization temperature to AC$_3$ transformation point temperature.

4. The method of claim 3, wherein said step of annealing continuously the cold-rolled steel sheets includes annealing continuously the cold-rolled sheets at a temperature of a recrystallization temperature to less than 800° C.

5. The method of claim 1 wherein said high strength steel sheets having good bake-hardenability and good press-formability have a tensile strength of 35 to 47 Kg/mm$^2$, bake hardenability value of 2 to 6.5 Kg/mm$^2$ and Lankford value of 1.47 or higher.

6. The method of claim 2 wherein said high strength steel sheets having good bake-hardenability and good press-formability have a tensile strength of 35 to 47 Kg/mm$^2$, bake hardenability value of 2 to 6.5 Kg/mm$^2$ and Lankford value of 1.47 or higher.

7. The method of claim 3 wherein said high strength steel sheets having good bake-hardenability and good press-formability have a tensile strength of 35 to 47 Kg/mm$^2$, bake hardenability value of 2 to 6.5 Kg/mm$^2$ and Lankford value of 1.47 or higher.

8. The method of claim 4 wherein said high strength steel sheets having good bake-hardenability and good press-formability have a tensile strength of 35 to 47 Kg/mm$^2$, bake hardenability value of 2 to 6.5 Kg/mm$^2$ and Lankford value of 1.47 or higher.

* * * * *